(12) United States Patent
Yatsuda et al.

(10) Patent No.: US 7,645,062 B2
(45) Date of Patent: Jan. 12, 2010

(54) LIGHT SOURCE AND VEHICLE LAMP

(75) Inventors: Yasushi Yatsuda, Tokyo (JP); Teruo Koike, Tokyo (JP); Takuya Kushimoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 246 days.

(21) Appl. No.: 10/808,552

(22) Filed: Mar. 25, 2004

(65) Prior Publication Data

US 2005/0041434 A1    Feb. 24, 2005

(30) Foreign Application Priority Data

Aug. 20, 2003   (JP)   ............... 2003-208077

(51) Int. Cl.
*F21S 8/10*   (2006.01)
(52) U.S. Cl. ............... 362/545; 362/548; 362/544; 362/543
(58) Field of Classification Search ............... 362/800, 362/296, 543–555, 539, 237
See application file for complete search history.

(56) References Cited

U.S. PATENT DOCUMENTS

| | | | |
|---|---|---|---|
| 6,038,387 A | 3/2000 | Machida | |
| 6,441,943 B1 | 8/2002 | Roberts et al. | |
| 6,565,247 B2 * | 5/2003 | Thominet | 362/545 |
| 6,601,982 B1 * | 8/2003 | Begemann et al. | 362/545 |
| 6,639,360 B2 | 10/2003 | Roberts et al. | |
| 6,666,567 B1 * | 12/2003 | Feldman et al. | 362/237 |
| 6,700,502 B1 * | 3/2004 | Pederson | 340/815.45 |
| 6,855,958 B2 | 2/2005 | Sato et al. | |
| 6,882,110 B2 | 4/2005 | Ishida et al. | |
| 6,891,333 B2 | 5/2005 | Tatsukawa et al. | |
| 6,948,836 B2 | 9/2005 | Ishida et al. | |
| 6,951,416 B2 | 10/2005 | Sazuka et al. | |
| 6,960,007 B2 * | 11/2005 | Ishida et al. | 362/538 |
| 6,997,587 B2 | 2/2006 | Albou | |
| 2001/0019486 A1 | 9/2001 | Thominet | |
| 2002/0093820 A1 * | 7/2002 | Pederson | 362/241 |
| 2002/0191395 A1 | 12/2002 | Fleury | |
| 2003/0198060 A1 | 10/2003 | Ishida et al. | |

(Continued)

FOREIGN PATENT DOCUMENTS

EP    1403135    3/2004

(Continued)

OTHER PUBLICATIONS

Search Report for EP Patent App. No. 04009167.0 (Apr. 3, 2006).

(Continued)

*Primary Examiner*—Anabel M Ton
(74) *Attorney, Agent, or Firm*—Cermak Kenealy Vaidya & Nakajima LLP

(57) ABSTRACT

A light source apparatus for vehicle lamps and particularly vehicle headlights can include a plurality of LED elements mounted in a cavity located on a base surface or on a base. Each of the LED elements can be arranged in such a manner as to form an emission shape and a brightness distribution that is suited for a light distribution pattern, and especially a light distribution pattern for vehicle headlight.

32 Claims, 16 Drawing Sheets

U.S. PATENT DOCUMENTS

| | | |
|---|---|---|
| 2003/0230757 A1 | 12/2003 | Suehiro et al. |
| 2004/0018446 A1 | 1/2004 | Aoki et al. |
| 2004/0042212 A1* | 3/2004 | Du et al. .................... 362/296 |
| 2004/0090602 A1* | 5/2004 | Imade ........................ 353/102 |
| 2004/0090790 A1 | 5/2004 | Ishida et al. |
| 2004/0130907 A1 | 7/2004 | Albou |
| 2004/0136197 A1 | 7/2004 | Ishida |
| 2004/0136202 A1 | 7/2004 | Ishida et al. |
| 2004/0160772 A1 | 8/2004 | Tatsukawa et al. |
| 2004/0160783 A1 | 8/2004 | Tatsukawa et al. |
| 2004/0196663 A1* | 10/2004 | Ishida et al. ................ 362/539 |
| 2004/0202006 A1* | 10/2004 | Pien .......................... 362/545 |
| 2004/0208020 A1 | 10/2004 | Ishida |
| 2004/0223338 A1 | 11/2004 | Koike et al. |
| 2004/0257827 A1 | 12/2004 | Ishida et al. |
| 2005/0041434 A1 | 2/2005 | Yatsuda et al. |
| 2005/0041436 A1 | 2/2005 | Ishida |
| 2005/0213341 A1* | 9/2005 | Wehner ...................... 362/545 |

FOREIGN PATENT DOCUMENTS

| | | |
|---|---|---|
| EP | 1418621 | 5/2004 |
| EP | 1447616 | 8/2004 |
| EP | 1447617 | 8/2004 |
| GB | 2400166 | 10/2004 |
| GB | 2402203 | 12/2004 |
| JP | H02-032194 A | 2/1990 |
| JP | 07-211940 | 8/1995 |
| JP | H08-142406 A | 6/1996 |
| JP | 09-321341 | 12/1997 |
| JP | H11-054802 A | 2/1999 |
| JP | 2001-177146 A | 6/2001 |
| JP | 2001-266620 A | 9/2001 |
| JP | 2001-345482 A | 12/2001 |
| JP | 2002-072934 A | 3/2002 |
| JP | 2002-336275 A | 11/2002 |
| JP | 2003-031007 | 1/2003 |
| JP | 2003-031007 A | 1/2003 |
| JP | 2003-031011 | 1/2003 |
| JP | 2003-31011 A | 1/2003 |
| JP | 2003-123517 | 4/2003 |
| JP | 2004-063499 | 2/2004 |
| WO | 2004/088201 | 10/2004 |

OTHER PUBLICATIONS

Office Action from Japanese Patent Application No. 2003-208077 (Jul. 10, 2008). Final Office Action from Japanese Patent Application No. 2003-208077 (Oct. 14, 2008) Notice of Allowance from Japanese Patent Application No. 2003-208077 (Apr. 17, 2009).

Office Action from Chinese Patent Application No. 200410037265.5 (Mar. 7, 2008).

* cited by examiner (A)

(B)

(A)

(B)

(A)

(B)

LIGHT SOURCE AND VEHICLE LAMP

This invention claims the benefit of Japanese patent application No. 2003-208077, filed on Aug. 20, 2003, which is hereby incorporated by reference.

FIELD OF THE INVENTION

The present invention relates to a light source and more particularly a light source for a vehicle lamp or headlight. The light source can employ a plurality of LED elements and can be configured as a vehicle lamp, such as a headlight or an auxiliary headlight.

DESCRIPTION OF THE RELATED ART

Today, discharge lamps such as halogen lamps or HIDs are used as light sources for headlights, auxiliary headlights and other vehicle lamps.

However, a white LED light source is drawing attention as a possible substitute for the existing light sources, and its application to vehicle lamps for illumination purposes is becoming more realistic as a result of recent achievements in increasing the efficiency and manufacturability of high output and high brightness LED light sources.

The white LED light source has a number of advantages over the aforementioned existing light sources, including its possible use as a non-disposable (permanent) light source due to its longer life, and environmental superiority. For example, the white LED light source does not require the use of mercury or other harmful substances, and makes it possible to use lower power consumption due to better lighting fixture efficiency than conventional HID.

It has been conceived that vehicle lighting fixtures, such as those shown in FIGS. 13 and 14, can incorporate a plurality of LED elements. That is, a projector-type vehicle lighting fixture has been conceived that can use LED elements as light sources.

The vehicle lighting fixture 1 comprises a plurality of white LED light sources 3, arranged on a spherical surface as shown in FIG. 13 or a planar surface as shown in FIG. 14 relative to a focus F at the back of a non-spherical convex lens 2 that is used for collecting light. A light shielding plate 4 is arranged between the white LED light sources 3 and the non-spherical convex lens 2.

Each of the white LED light sources 3 can be constructed by filling the area surrounding a blue LED element 3b (which is located in a cavity 3a) with a resin 3c containing fluorescent substance. The white LED light sources 3 are designed to externally emit white light as a result of color mixture between a yellow light L2—excitation light—and a blue light L1 from the blue LED element 3b. The mixture occurs when the fluorescent substance is excited after the blue light L1, emitted from the blue LED element 3b, strikes the fluorescent substance to create the excitation light L2.

A white LED light source 3 located at the center can be arranged on the optical axis of the non-spherical convex lens 2, while the other white LED light sources 3 can be arranged such that respective optical axes pass near the focus F of the non-spherical convex lens 2.

The light shielding plate 4 is preferably arranged near the focus F of the non-spherical convex lens 2 and formed so as to produce a so-called low-beam light distribution pattern.

According to the vehicle headlight 1 thus configured, light emitted from each of the white LED light sources 3 travels toward the focus F of the non-spherical convex lens 2 and is collected by the non-spherical convex lens 2. Unnecessary or unwanted light is blocked by the light shielding plate 4 provided near the focus F. Thus, the light can be irradiated forward in a light distribution pattern having a so-called low-beam cutoff as shown in FIG. 16.

In the vehicle headlight 1 thus configured, however, even if the latest LED elements with high output and brightness are employed for the white LED light sources 3, their light beam and brightness are insufficient for use as a vehicle lamp, including an automobile headlight or an auxiliary headlight. To meet the headlight light distribution standards, therefore, it is necessary to provide a large number of the vehicle headlights 1 configured as described above.

In order to arrange more LED light sources in the vehicle headlight 1, a longer distance is required between the white LED light sources 3 and the light shielding plate 4. Therefore, emission portions of the LED light sources are enlarged when projected on the light shielding plate by lenses 22 on the LED emission portion side. Since the enlarged projected images are projected to the front of the vehicle by the non-spherical convex lens, the luminous intensity needed for a vehicle headlight cannot be obtained even when a number of LED light sources are used. Even if a plurality of vehicle headlights 1 are arranged so as to entirely cover the front surface of the vehicle, the necessary luminous intensity still cannot be achieved. Further, it would be extremely difficult to align the optical axes of many LED light sources.

In contrast, in the case of an indicator lamp such as a brake lamp which is designed for visual recognition, such a light source apparatus that includes a number of vehicle headlights 1 can sufficiently meet the necessary light distribution conditions. In the case of a headlight or other vehicle lamp that must irradiate light some 100 m to 200 m ahead, the maximum luminous intensity on the optical axis is considerably important.

In the vehicle headlight 1, however, luminous intensity of light irradiated forward is roughly determined by the brightness at the emission portion and by the optical system size. As a result, to obtain more luminous intensity from a vehicle headlight that uses a single light source, it is necessary to increase the brightness of the light source's emission portion or the size of the optical system. Of these options, increasing the size of the optical system is subject to constraints in terms of vehicle design, practicality, and others. To meet the light distribution characteristic necessary for a vehicle headlight, therefore, it is generally important to increase the brightness of the light source's emission portion.

As shown in FIG. 9, a light distribution pattern includes a horizontal line light cutoff that eliminates or reduces dazzling or glaring light from being projected onto oncoming vehicles. The light distribution pattern can include an elbow pattern for irradiating light in the direction of pedestrians and traffic signs. The term "cutoff" typically means the location at which there is a significant difference between light and dark in luminous intensity. A high center luminous intensity is desired to improve the driver's visibility in the front of the vehicle.

In order to produce such a light distribution pattern, the vehicle headlight 1 can be provided with a light shielding plate 4, thus blocking unnecessary or unwanted light with the light shielding plate 4 and providing the low-beam light distribution pattern.

At this time, to form a cutoff for the low-beam light distribution pattern, it is necessary to form the cutoff with the light shielding plate 4 located at the brightest portion near the optical axis of each of the white LED light sources 3. For this reason, the optical axis of each of the white LED light sources 3 is arranged such that each axis points to a location near the focus F of the non-spherical convex lens 2. This causes, for example, nearly half the luminous intensity or approximately 45% of emitted luminous intensity from each of the white LED light sources 3 to be blocked and lost, resulting in extremely low utilization efficiency of light from the vehicle headlight 1.

SUMMARY OF THE INVENTION

In light of the foregoing, the present invention is designed to provide a light source and vehicle lamp, including a vehicle headlight and auxiliary headlight, all of which are suited for irradiating light forward, and which can use a plurality of LED elements.

According to a first aspect of the present invention, a light source for a vehicle headlight can include a plurality of LED elements mounted in a cavity formed on a base surface or on a base, wherein each of the LED elements is arranged in such a manner as to form an emission shape and to form a brightness distribution that is suited for a light distribution pattern of a vehicle headlight. Each of the LED elements can be substantially rectangular in exterior shape. Alternatively, each of the LED elements can be substantially triangular or parallelogrammic in exterior shape. The LED elements are preferably different from one another in size.

The LED elements are also preferably driven by different drive currents. At least some of the LED elements are preferably arranged along a given linear ridgeline. In addition, at least some of the LED elements are preferably arranged along two linear ridgelines. The given angle between a first line of LED elements and a second line of LED elements is preferably any of 15 to 45 degrees.

According to another aspect of the present invention, a vehicle headlight can include any of the above light source apparatuses, a light shielding means can be arranged in close vicinity to the light source apparatus in the light emission direction thereof that is configured to cut off light from the LED elements into the same shape as a light distribution pattern for vehicle headlight; and a projection lens can be arranged such that the projection lens' focus located in the direction of the light source is located in the vicinity of the light shielding means, wherein the projection lens irradiates forward the shape of an emission portion of the light source apparatus cut off by the light shielding means.

Each LED element can be arranged so as to form an emission shape and to provide a brightness distribution suited for a given light distribution pattern, allowing a light distribution pattern and brightness distribution suited for low beam to be obtained when the emission shape of each LED element is projected forward by the projection lens and after formation of a cutoff by the light shielding means. Formation of the emission shape of each LED element in a shape suited for the light distribution pattern ensures that the amount and quantity of light that is blocked by the light shielding means is reduced, thus improving utilization efficiency of light from each LED element and producing brighter irradiated light.

If each LED element is substantially rectangular in exterior shape and arranged side by side, irradiated light of higher brightness can be obtained by arranging the LED elements more closely. If each LED element is substantially triangular or parallelogrammic in exterior shape and arranged side by side, irradiated light of higher brightness can also be obtained by arranging the LED elements more closely. Moreover, it is possible to match the exterior shape of an emission region of each LED element of the light source with the shape of the road side edge towards which light is irradiated, ensuring a good fit with the road side edge and further improving visibility.

If the LED elements are different in size and are arranged side by side, it is possible to roughly match the shape of the overall emission portion with the edge of the light shielding plate, further reducing light quantity that is lost due to blocking by the light shielding plate.

If the LED elements are driven by different drive currents, it is possible to adjust the brightness distribution of the overall emission portion as appropriate by selectively driving each of the LED elements using different drive currents such that each LED element emits light at an appropriate emission intensity.

It is possible to emphasize the light distribution cutoff (difference between light and dark in luminous intensity) by arranging at least some of the LED elements along a given linear ridgeline. If at least some of the LED elements are arranged along two linear ridgelines, when they are arranged side by side, it is possible to roughly match the shape of the overall emission portion with the edge of the light shielding plate, further reducing light quantity loss attributed to blocking by the light shielding plate.

Light emitted from each of the LED elements of the light source can fall on the incidence surface of the projection lens after passing the light shielding means and can be converged by the projection lens, causing the light to be irradiated forward. A given light distribution characteristic can thus be formed by the light shielding means, such as the so-called low-beam light distribution characteristic that eliminates or reduces dazzling or glaring light from being projected onto oncoming vehicles.

Each LED element can be arranged so as to form the emission shape and to provide the brightness distribution suited for the given light distribution pattern. Thus the quantity of light blocked by the light shielding means can be reduced during cutoff formation, and utilization efficiency of light from each LED element can be improved allowing formation of a clear cutoff as a result of blocking of light passing near the end edge of the light shielding means can be realized.

Thus, by using a plurality of LED elements and projecting each LED element forward by the projection lens via the light shielding means, it is possible to improve utilization efficiency of light emitted from each LED element and obtain a light distribution pattern and brightness distribution that is necessary and/or desired for a vehicle headlight. Therefore, it is possible to provide a light source apparatus and a vehicle lamp suited for use as headlight or auxiliary headlight by using a plurality of LED elements.

BRIEF DESCRIPTION OF THE DRAWINGS

The above and other aspects, features and advantages of the present invention will become more apparent from the following detailed description when taken in conjunction with the accompanying drawings, in which.

DESCRIPTION OF PREFERRED EMBODIMENTS

Preferred embodiments of the present invention will be described below in detail with reference to FIGS. 1 to 12.

It should be borne in mind that while the embodiments described below are subject to various technically preferred features because they are preferred specific examples, the scope of the present invention is not limited thereby.

Figure 1:
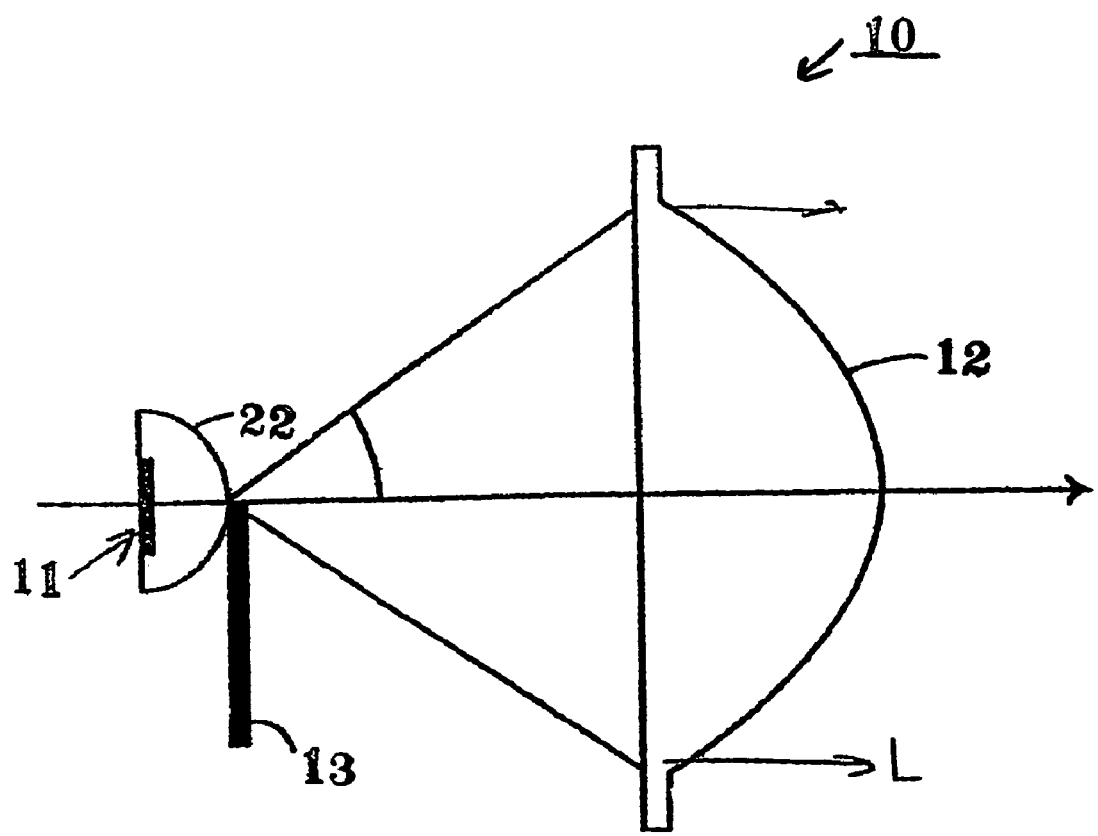
FIG. 1 is a schematic side view of an embodiment of a vehicle lamp made in accordance with the principles of the present invention.

FIG. 1 illustrates a configuration of a vehicle lamp and light source apparatus made in accordance with the principles of the present invention.

In FIG. 1, a vehicle lamp 10 can include a light source apparatus 11, a projection lens 12 for converging light from the light source apparatus 11, and a light shielding plate 13 located in the optical path between the light source apparatus 11 and the projection lens 12. The light shielding plate 13 can be configured to form a given light distribution shape and characteristic to the light emitted from the vehicle lamp 10.

Figure 2:
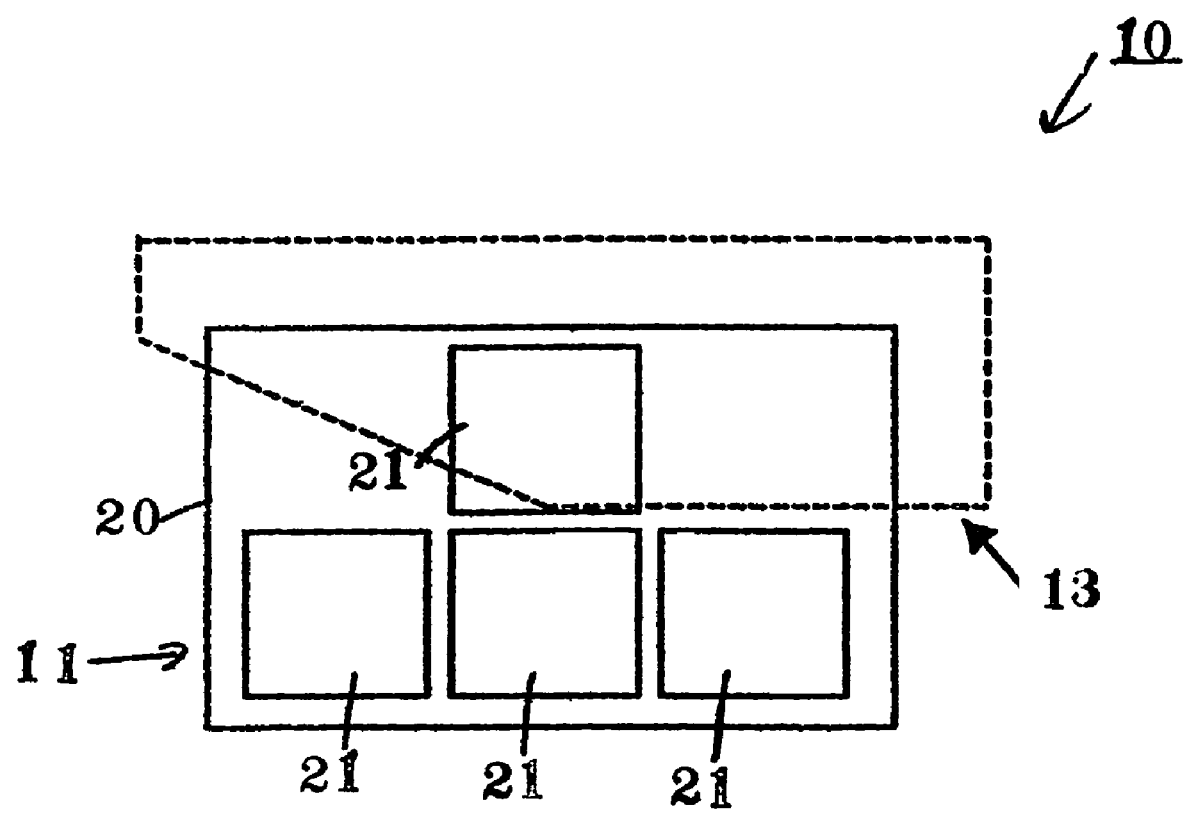
FIG. 2 is a rear view of the light source apparatus used in the vehicle lamp shown in FIG. 1.

The light source apparatus 11 can include a plurality of LED elements 21 installed on a base 20 and a lens portion 22 formed so as to surround each of the LED elements 21, as shown in FIG. 2.

The LED elements 21 can have a rectangular exterior shape when viewed along the optical axis, and can be installed in close relationship to each other on the base 20. A fluorescent substance layer 23 can be formed so as to surround the LED elements 21.

The projection lens 12 is preferably a convex lens that is arranged such that the optical axis of the projection lens 12 is aligned with a central axis extending nearly horizontally toward the front of the base of the light source apparatus 11.

The light shielding plate 13 can include a light shielding material that is arranged on the optical axis between the light source apparatus 11 and the projection lens 12 and directly adjacent the light source apparatus 11 (preferably in contact with the lens portion 22 of the light source apparatus 11 as shown in FIG. 1) and in the vicinity of the focus F on the light source side of the projection lens 12. The light shielding plate 13 forms a so-called cutoff by blocking part of the light emitted from each of the LED elements 21 of the light source apparatus 11, thus adjusting the light distribution pattern projected by the projection lens 12 into a so-called low-beam light distribution pattern.

Further, in the light source apparatus 11, the LED elements 21 can be arranged such that they are located only in the vicinity of the region on the base 20 where light can be irradiated onto the incidence surface of the projection lens 12 via the light shielding plate 13, so as to form the emission shape and the brightness distribution suited for the given light distribution pattern as shown in FIG. 2.

Figure 3:
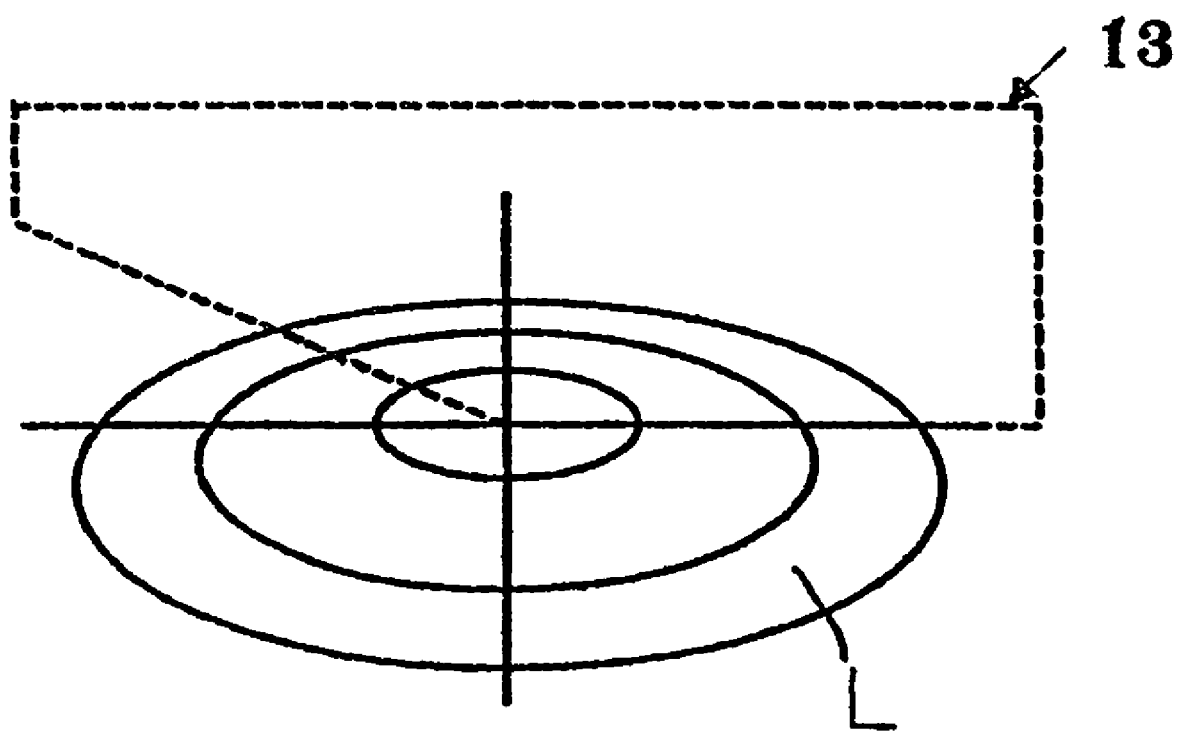
FIG. 3 is a front schematic view showing a brightness distribution for the vehicle lamp shown in FIG. 1.

This shifts downward the brightness distribution of light that is irradiated forward from the light source apparatus 11 so as to reduce light quantity loss that is attributed to blocking by the light shielding plate 13, as shown in FIG. 3.

In a vehicle lamp 10 according to the present embodiment and configured as a headlight, light L can be emitted from each of the LED elements 21 of the light source apparatus 11 when power is supplied to the LED elements 21. The light L falls on the incidence surface of the projection lens 12 after passing (and being partially blocked by) the light shielding plate 13. The light L is then converged by the projection lens 12, causing the light L to be irradiated forward along an optical axis. Part of the light L is blocked by the light shielding plate 13, forming a cutoff and projecting the image of the cutoff forward and thereby providing the low-beam light distribution pattern for a headlight.

The LED elements 21 of the light source 11 can be arranged on the base 20 so as to form the emission shape and the brightness distribution suited for a given light distribution pattern. Thus the loss of light quantity emitted from each of the LED elements 21 due to blocking by the light shielding plate 13 can be extensively reduced and utilization efficiency of light emitted from each of the LED elements 21 can be extensively improved.

Further, the plurality of LED elements 21 can be arranged close to each other in the light source apparatus 11, increasing emission intensity at the fluorescent substance layer 23 and between the LED elements 21, thus making the light source apparatus 11 even brighter.

Light L from each of the LED elements 21 that passes near the edge of the light shielding plate 13 can be blocked by the light shielding plate 13, allowing formation of a clear cutoff.

According to the vehicle lamp 10, the LED elements 21 can be specially arranged on the base 20, thus minimizing light quantity loss as a result of blocking of light emitted from each of the LED elements 21 of the light source apparatus 11 and improving utilization efficiency of light from the LED elements 21.

Consequently, it is possible to obtain irradiated light of desired brightness while forming a cutoff by the light shielding plate 13, thus making a vehicle lamp suited for use as headlight by the use of a plurality of LED elements.

Figure 4:
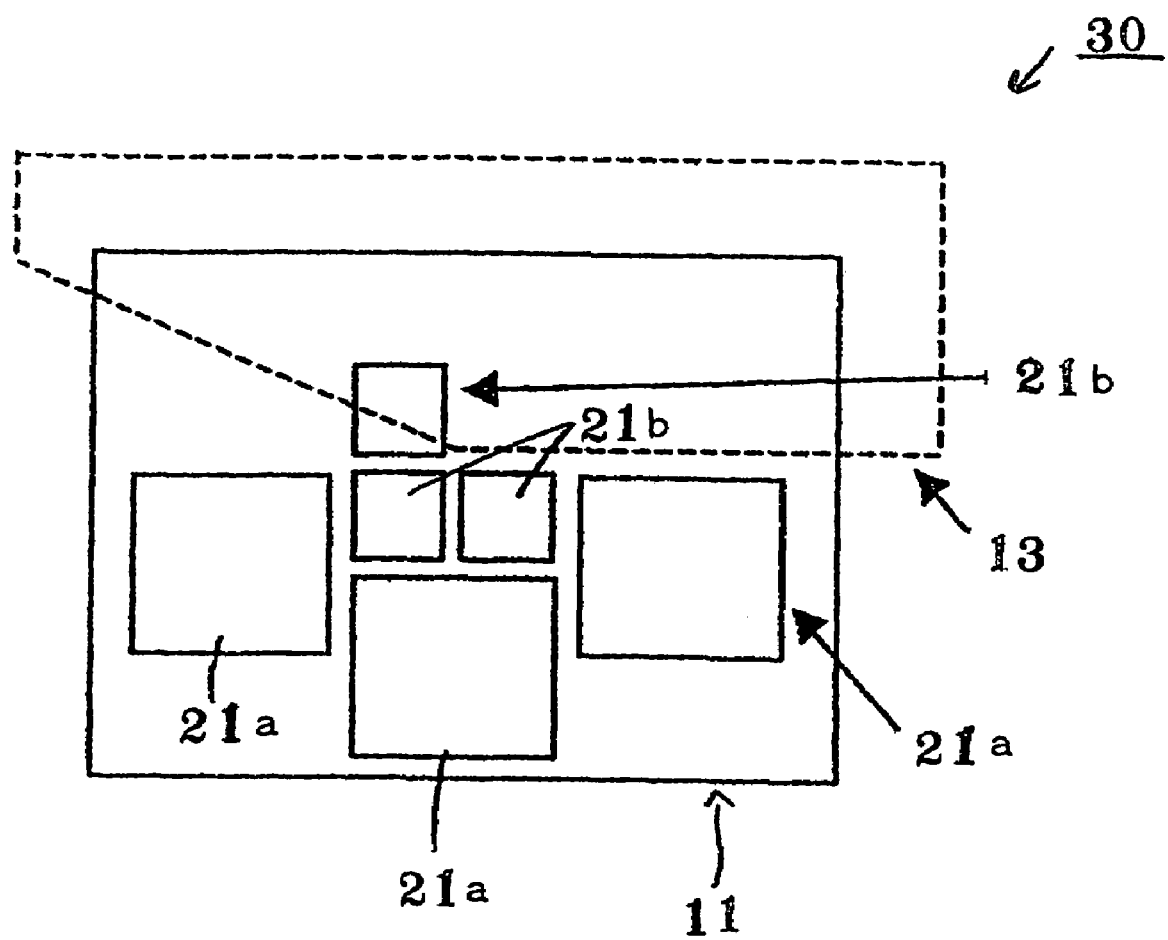
FIG. 4 is a rear view of an embodiment of a vehicle lamp and light source apparatus made in accordance with the principles of the present invention.

FIG. 4 illustrates another embodiment of the invention. In FIG. 4, a vehicle lamp 30, can have roughly the same configuration as the vehicle lamp 10, but differs from the vehicle lamp 10 shown in FIGS. 1 and 2 at least in that the light source apparatus 11 can include LED elements 21 of varying size. For example, the LED elements 21 can include relatively large LED elements 21a and relatively small LED elements 21b.

In this case, the relatively large LED elements 21a are preferably arranged at the bottom of a base portion, while the relatively small LED elements 21b are located in the vicinity of a cutoff line of the light shielding plate 13.

The relatively large LED elements 21a are suited for diffuse light distribution because of lower average brightness attributed to the large area of the LED element 21a. The relatively small LED elements 21b are suited for collective light distribution due to higher average brightness attributed to the small area occupied by the LED element 21b.

The vehicle lamp 30 can function similar to the vehicle headlight 10 shown in FIGS. 1 and 2. However, it is possible to further reduce light quantity loss attributed to the blocking of light by the light shielding plate 13 and to intentionally form a high-brightness region with the relatively small LED elements 21b by arranging the relatively small LED elements 21b in the vicinity of the cutoff line of the light shielding plate 13.

Figure 5:
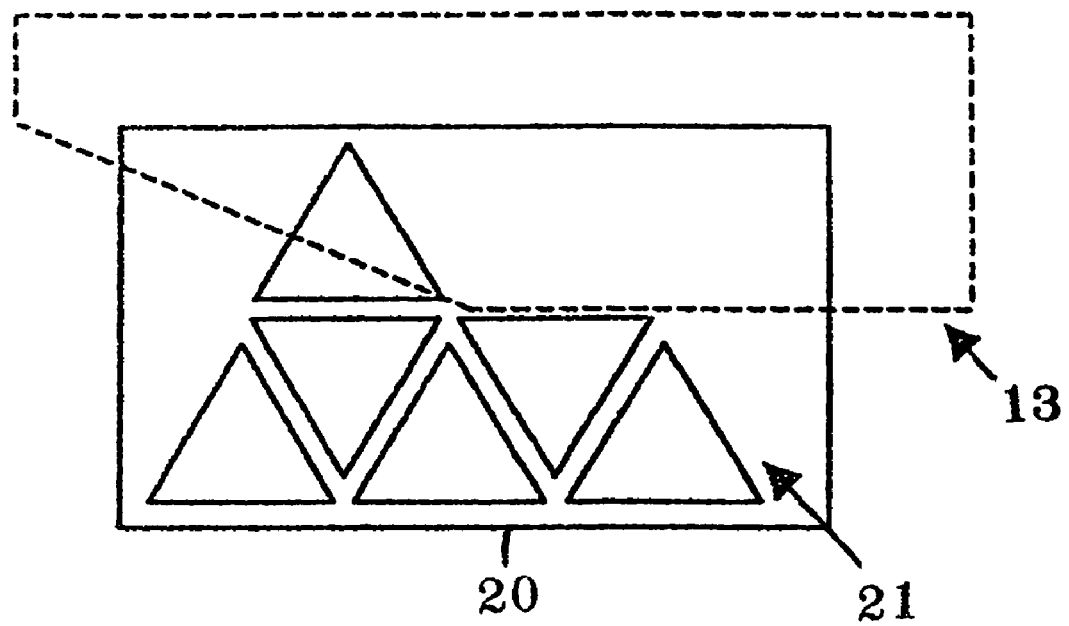
FIG. 5 is a rear view of another embodiment of a vehicle lamp and light source apparatus made in accordance with the principles of the present invention.
Figure 6:
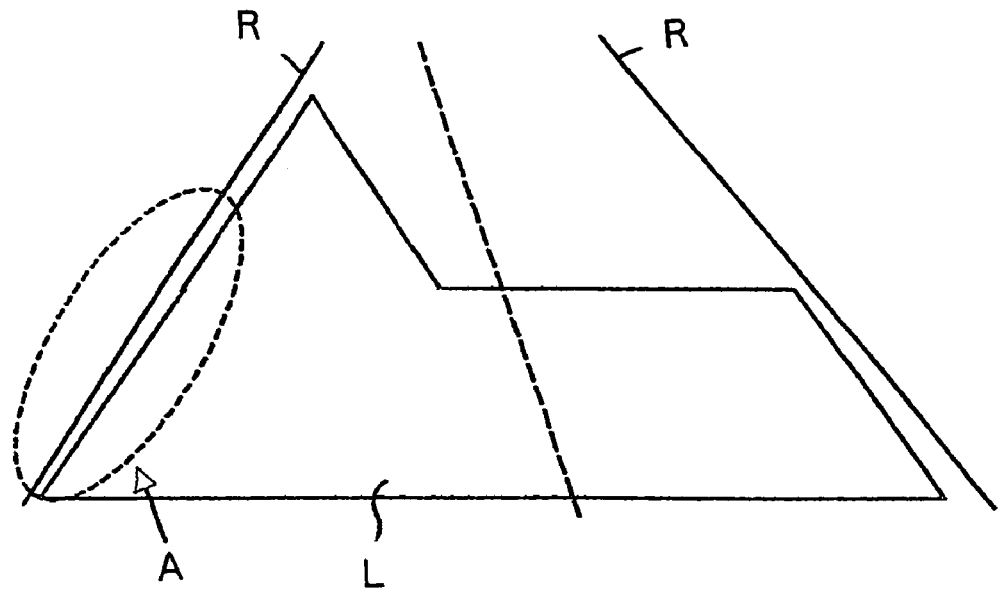
FIG. 6A illustrates a light distribution pattern on a roadway resulting from light that is irradiated to the front of a vehicle when using the vehicle lamp and light source apparatus of FIG. 5.
FIG. 6B illustrates a light distribution pattern on a roadway resulting from light that is irradiated to the front of a vehicle when using the vehicle lamp and light source apparatus of FIGS. 1 and 2.
Figure 6:
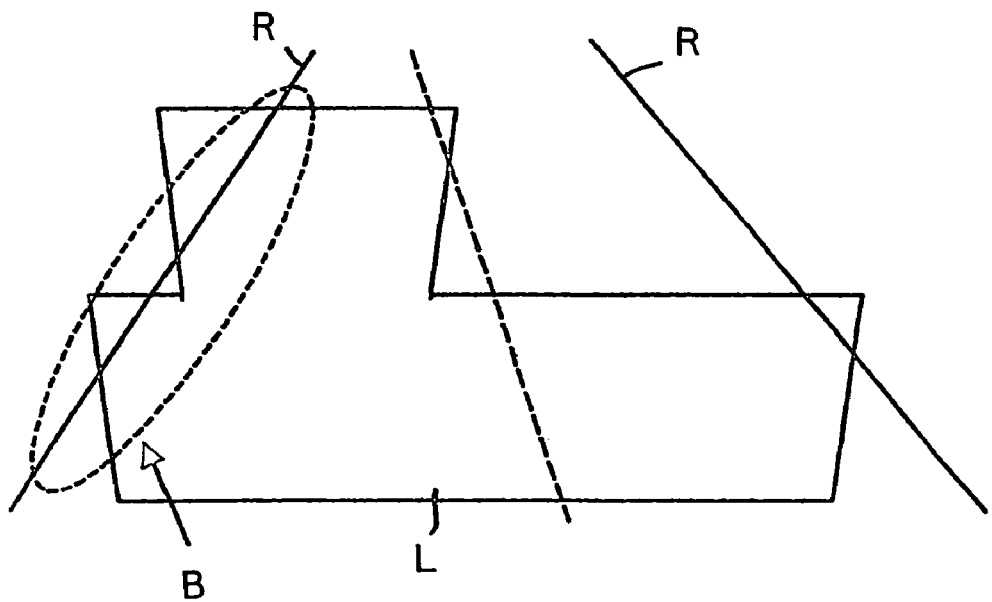

FIG. 5 shows a configuration of another embodiment of the invention. In FIG. 5, a vehicle lamp 40, although having roughly the same configuration as the vehicle lamp 10, differs from the vehicle lamp 10 shown in FIGS. 1 and 2 at least in that the light source apparatus 11 includes LED elements 21 which are triangular in exterior shape when viewed along the optical axis. In this case, the LED elements 21 can be arranged alternately upside down and right side up for even closer arrangement.

It should be understood that at least some of the LED elements 21 may be parallelogrammic in exterior shape, e.g., a shape formed by joining two triangles together, and that the triangular and parallelogrammic LED elements 21 may be combined as appropriate.

The vehicle lamp 40 can function similar to the vehicle lamp 10 shown in FIGS. 1 and 2, and the LED elements 21 can be arranged more closely and with a brighter fluorescent substance layer because of light arriving from a plurality of directions, thus increasing the overall emission intensity. Further, the exterior shape of the emission region of the LED elements 21 of the light source 11 can be formed by the triangular exterior shape of each of the LED elements 21 itself, thus ensuring good correspondence between the irradiated light L and a road side edge R, and further improving road visibility in the direction of travel of the automobile.

In contrast, in the case of the vehicle headlight 10 shown in FIGS. 1 and 2, each of the LED elements 21 is rectangular in their exterior shape, impairing, though to a small extent, the correspondence between the irradiated light L and the road side edge R.

Figure 7:
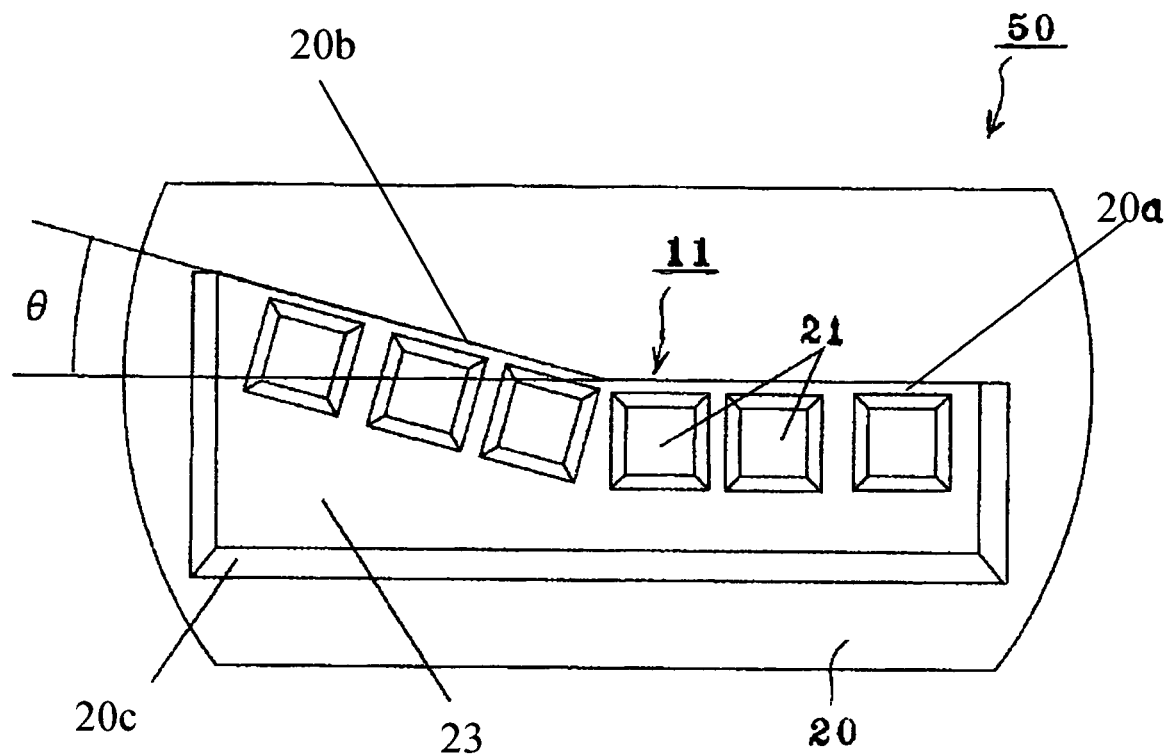
FIG. 7 is a front view of another embodiment of a vehicle lamp and light source apparatus made in accordance with the principles of the present invention.

FIG. 7 shows another embodiment of the present invention. In FIG. 7, a vehicle lamp 50, although having roughly the same configuration as the vehicle headlight 10, differs from the vehicle headlight 10 shown in FIGS. 1 and 2 at least in that the light source apparatus 11 includes some LED elements 21 that are arranged nearly horizontally to coincide with a horizontal portion of an edge of the light shielding plate 13 on one side of a center line (right side in the illustration) and other LED elements 21 that are arranged along a sloped line extending diagonally upward at a given angle θ to coincide with an elbow portion of an edge of the light shielding plate 13 located on the other side of the center line (left side in the illustration).

The given angle θ of the sloped line is selected, for example, to be from 15 to 45 degrees or so. Further, positioning portions 20a and 20b can be formed on the base 20 to coincide with the horizontal portion and the elbow portion of the edge of the light shielding plate 13. A cavity having cavity walls 20c can be provided in the top surface of the base 20 and the LED elements 21 can be located therein. The cavity walls 23c can help reflect light into the light distribution area.

The vehicle lamp 50 can function similar to the vehicle lamp 10 shown in FIGS. 1 and 2, and the LED elements 21 of the light source apparatus 11 can be arranged along the cutoff line of the edge of the light shielding plate 13, thus minimizing the loss of light quantity due to light blocked by the light shielding plate 13, and forming a clear cutoff for the light. If the vehicle lamp 50 is installed as a headlight in an automobile, installation can be simplified by ensuring that the positioning portions 20a and 20b on the base 20 of the light source apparatus 11 are parallel to the end edge of the light shielding plate 13.

Figure 8:
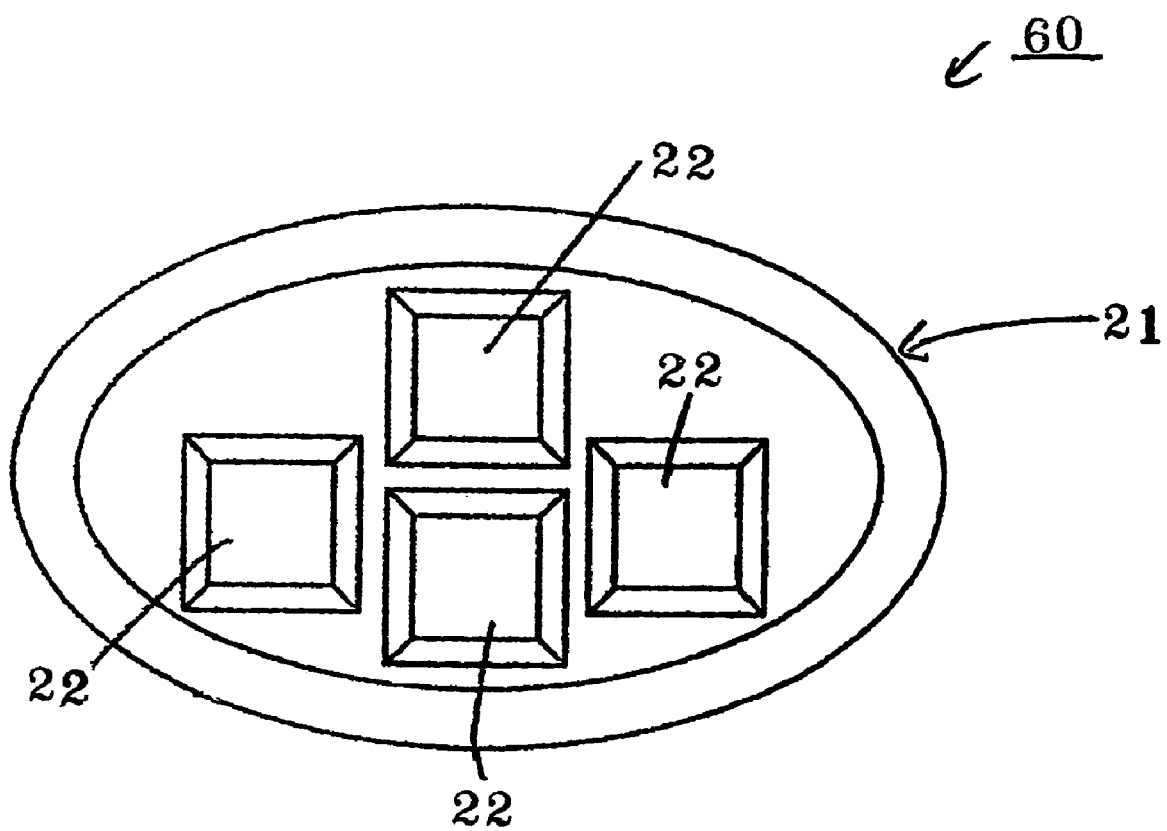
FIG. 8 is a front view of an embodiment of another vehicle lamp and light source made in accordance with the principles of the present invention.
Figure 9:
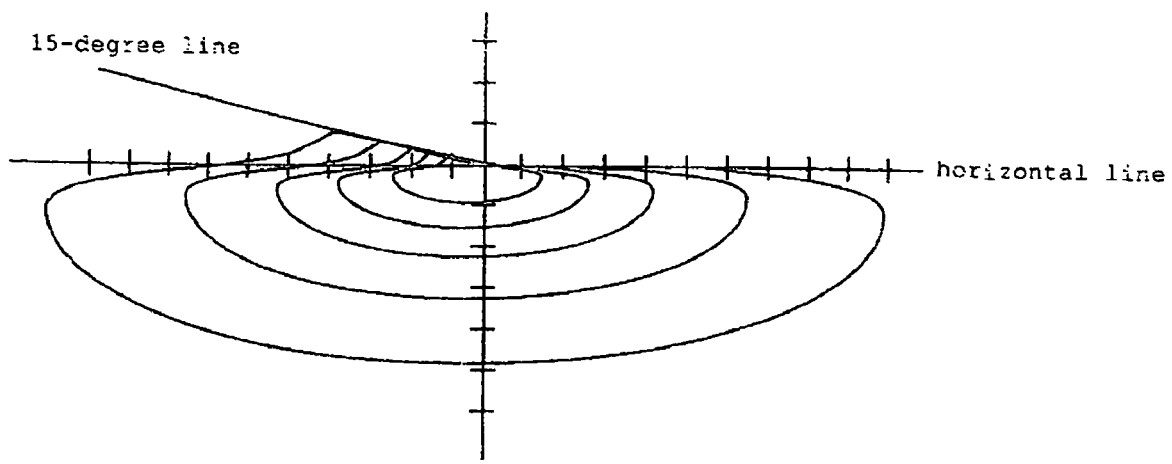
FIG. 9A illustrates a brightness distribution for light that is irradiated forward from the light source apparatus of FIG. 8.
FIG. 9B illustrates a brightness distribution for light that is irradiated forward from a projection lens of a vehicle lamp that includes the light source of FIG. 8.
Figure 9:
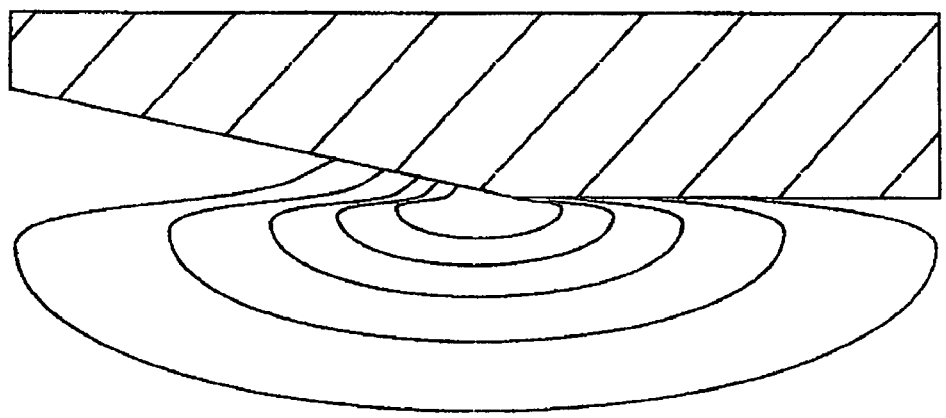
Figure 10:
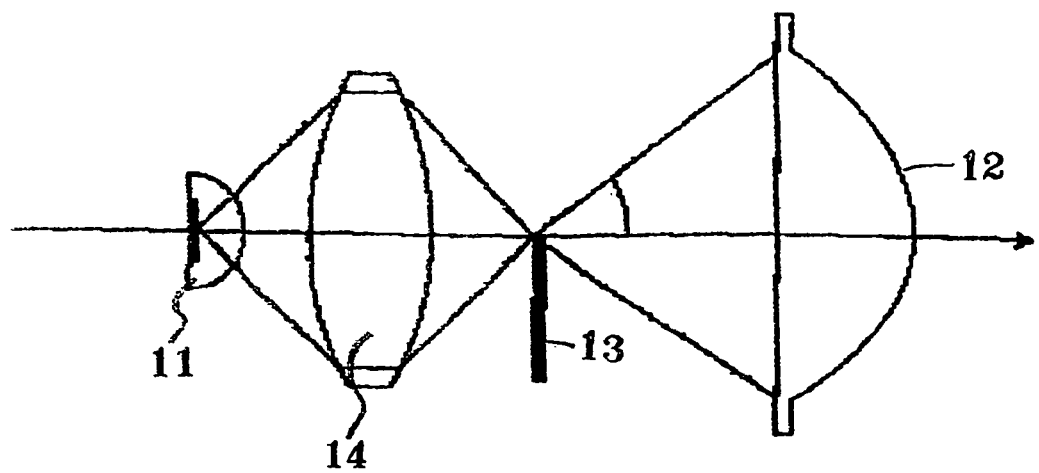
FIGS. 10A and B are schematic sectional views of modification examples of the vehicle lamp shown in FIG. 1.
Figure 10:
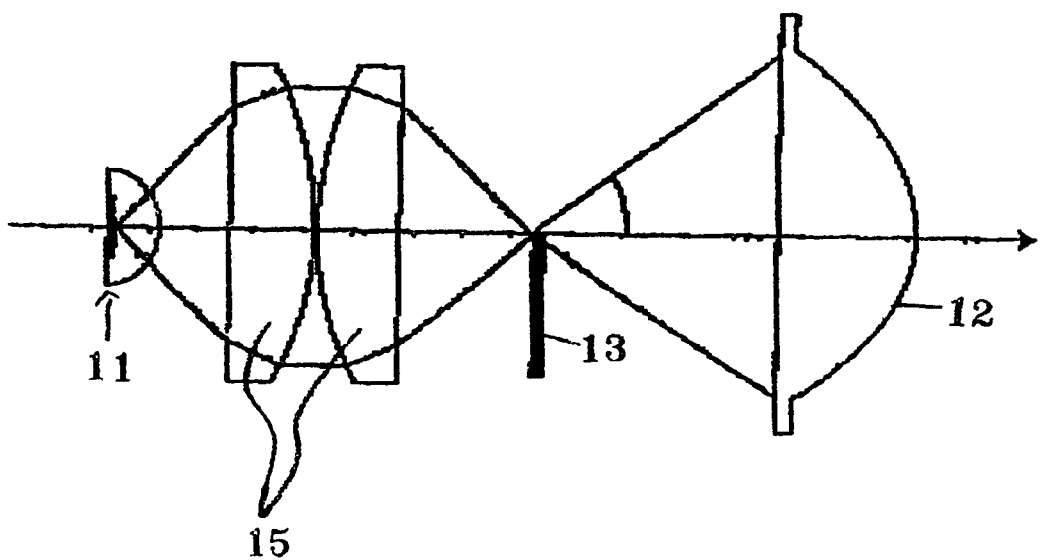

FIG. 8 illustrates a specific working example of a portion of a vehicle lamp made in accordance with the principles of the present invention. In FIG. 8, a vehicle lamp 60 can include LED elements 21, each of which include a high brightness portion at the center bottom portion and is made of four LED elements 22 so as to minimize blocking of light by the light shielding plate 13.

According to the vehicle lamp 60 thus configured, simulation results have shown that the maximum brightness is 1.3 times higher as compared with the LED element 21 made of the single LED element 22, and that loss of light quantity incident on the projection lens 12 can be suppressed by approximately 30% for improved light utilization efficiency.

The brightness distribution of the light source apparatus 11 is shown in FIG. 9A, which represents an ordinary light distribution for an automobile (a type of target luminous intensity distribution). The light distribution offers a given light distribution characteristic and achieves the brightness desired for a headlight. FIG. 9B shows a light source brightness distribution that is desired to meet the luminous intensity distribution as shown in FIG. 9A.

Although, in the vehicle lamps 10, 30, 40, 50 and 60 of the foregoing embodiments, the light shielding plate 13 is provided near the light source apparatus 11, this configuration is not necessary. For example, the emission shape may be projected forward with the projection lens 12 by forming the image of the emission shape of each of the LED elements 21 of the light source apparatus 11 in the vicinity of the light shielding plate 13 (at focus F of the projection lens 12) by using a single convex lens 14 or two lenses 15 as shown in FIG. 10A/10B.

Although each of the LED elements 21 of the light source apparatus 11 of the foregoing embodiments can be driven by a constant drive current, the LED elements 21 may be driven independently by different drive currents by providing a drive device that provides a drive circuit for each of the LED elements 21. The drive device can include a plurality of separate drive elements that each provide separate drive circuits for supplying separate drive currents to the LED elements 21. By driving the LED elements 21 independently in accordance with steering operation, turn signal status, braking status, vehicle speed, etc., it is possible to allow only some of the LED elements 21 to selectively emit light at higher brightness. Thus, for example, by fully illuminating and brightening the region of the light distribution pattern that corresponds to the left front of a vehicle brighter while the vehicle is maneuvering around a left curve on a roadway, it will become possible to implement the so-called AFS feature by electronic control alone and without using a mechanical drive mechanism. Therefore, the electronically controlled AFS feature, if installed in a vehicle, is less prone to malfunction due to vibrations or frequent use as compared with a mechanical drive mechanism. The electronically controlled AFS feature ensures high precision and tracking in response to steering, etc.

Further, although, in the foregoing embodiments, the edge of the light shielding plate 13 can be formed so as to eliminate dazzling light or light that is glaring to oncoming vehicles on the right-hand side in front of the vehicle by limiting low-beam light distribution for traffic on the left-hand side, a similar effect can be obtained, in the case of traffic traveling on the right-hand side, by reversing the horizontal arrangement of an edge 13a of the light shielding plate 13 and the LED elements 21.

Figure 11:
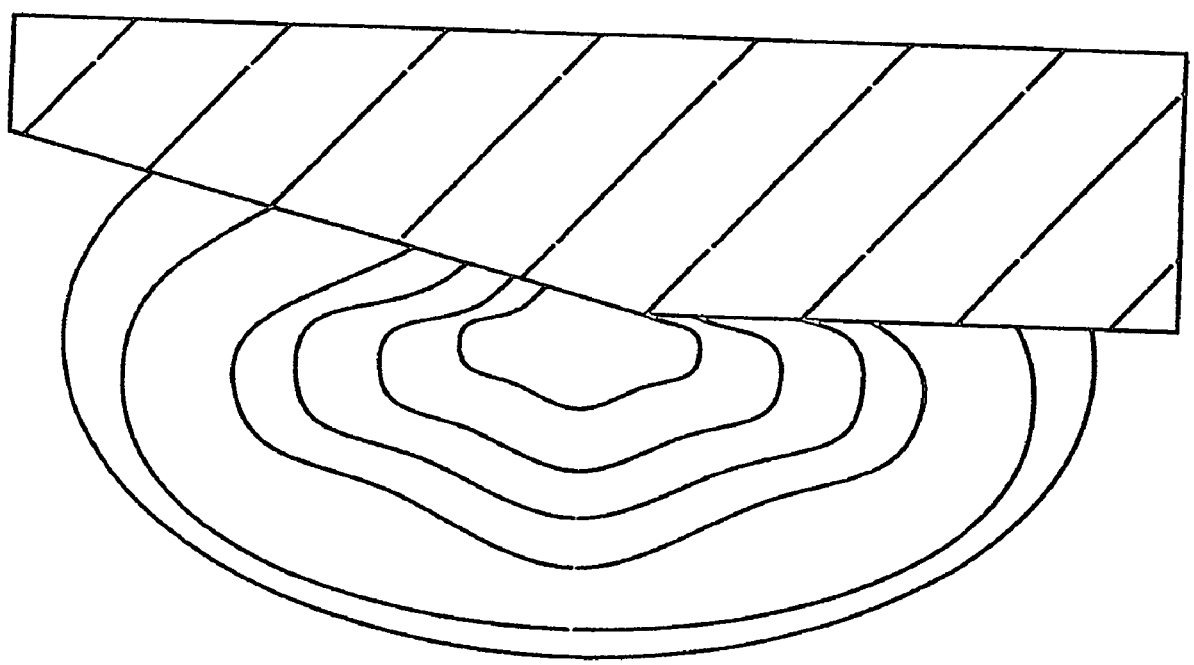
FIG. 11 is an illustration of an OVAL brightness distribution.
Figure 12:
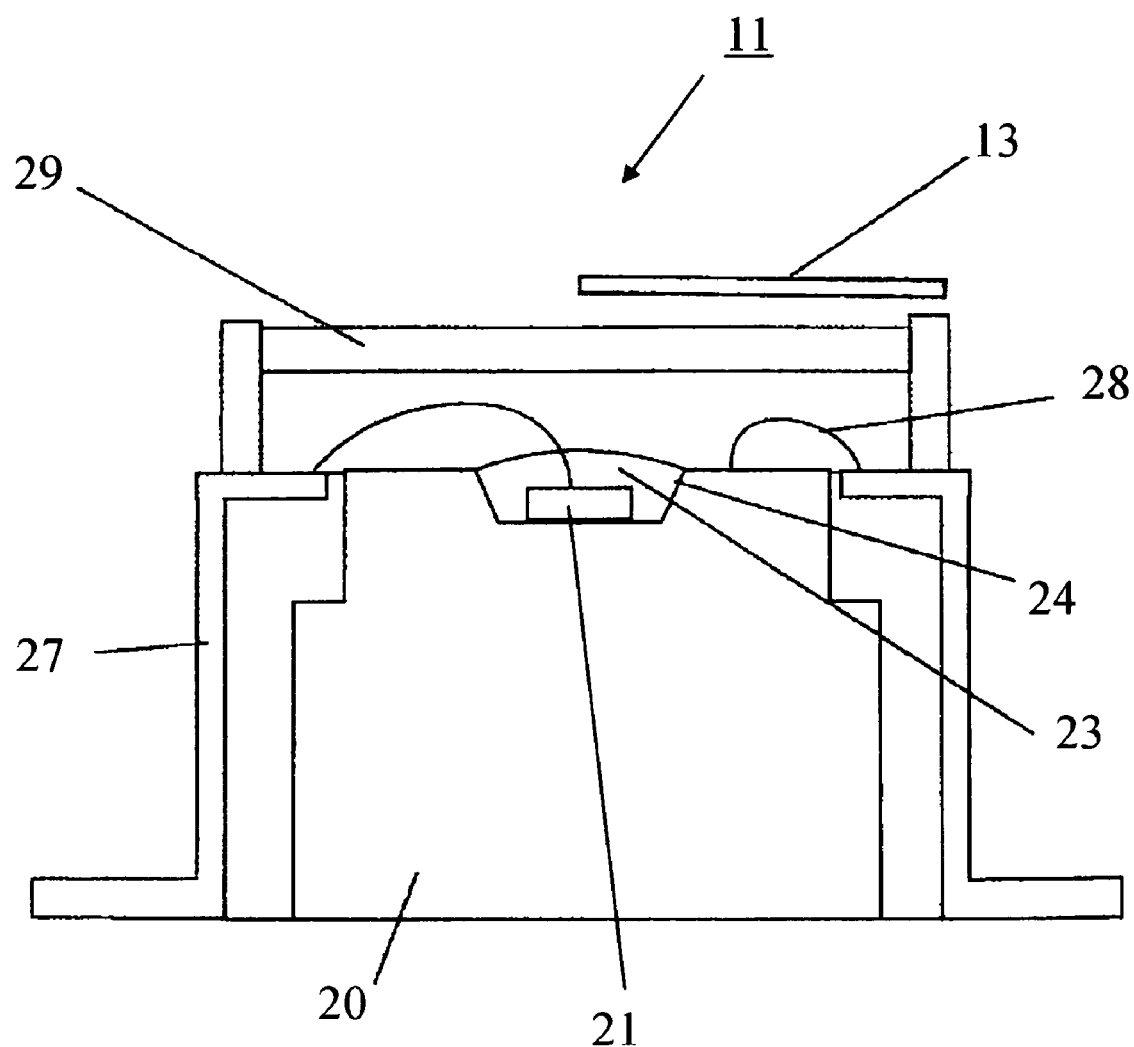
FIG. 12 is a cross-sectional view of an embodiment of a light source apparatus made in accordance with the principles of the present invention.
Figure 13:
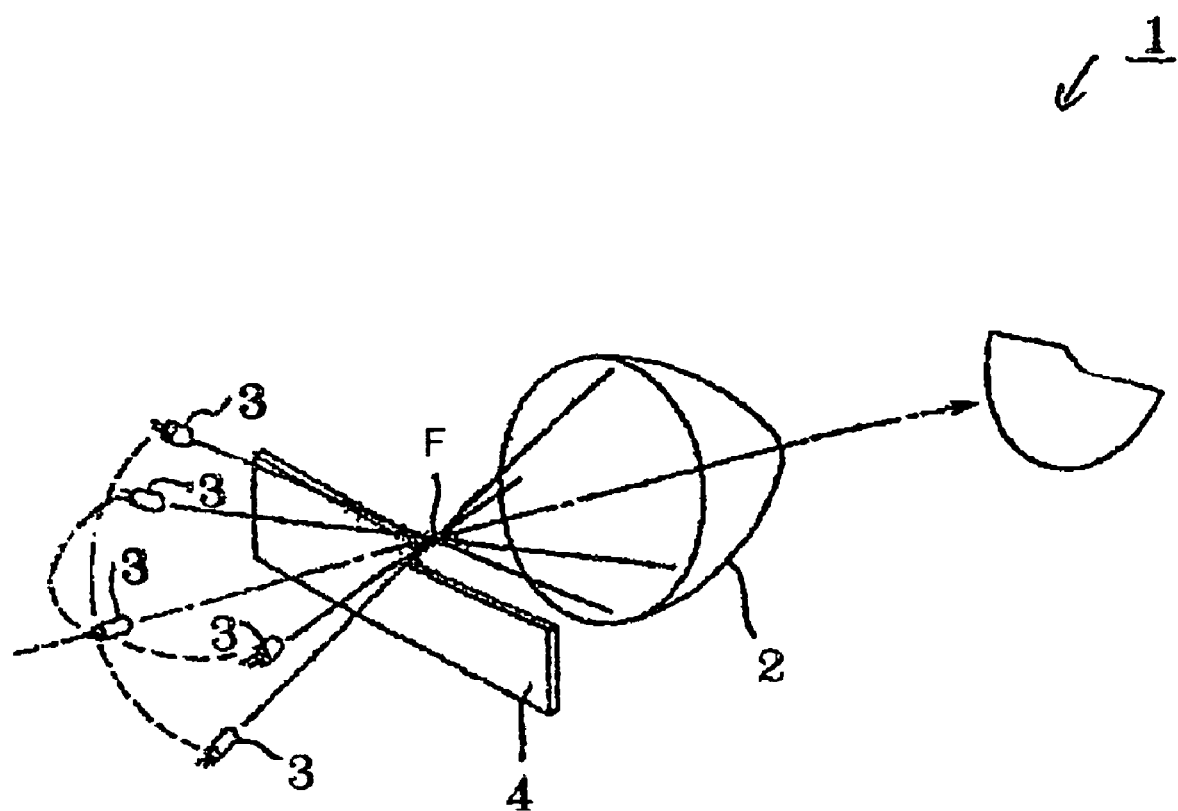
FIG. 13 is a schematic perspective view of a conventional vehicle headlight.
Figure 14:
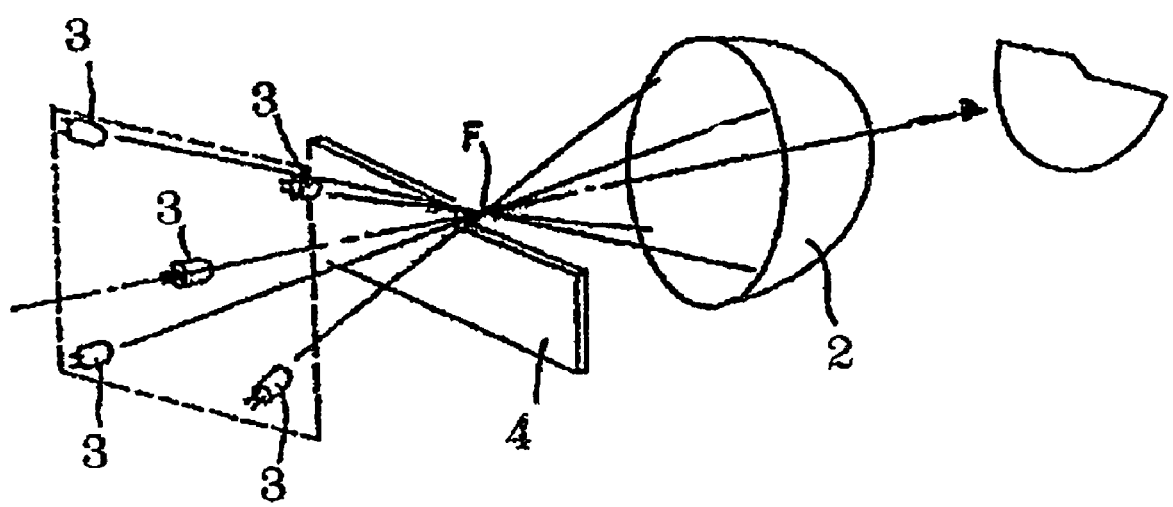
FIG. 14 is a schematic perspective view of a second conventional vehicle headlight.
Figure 15:
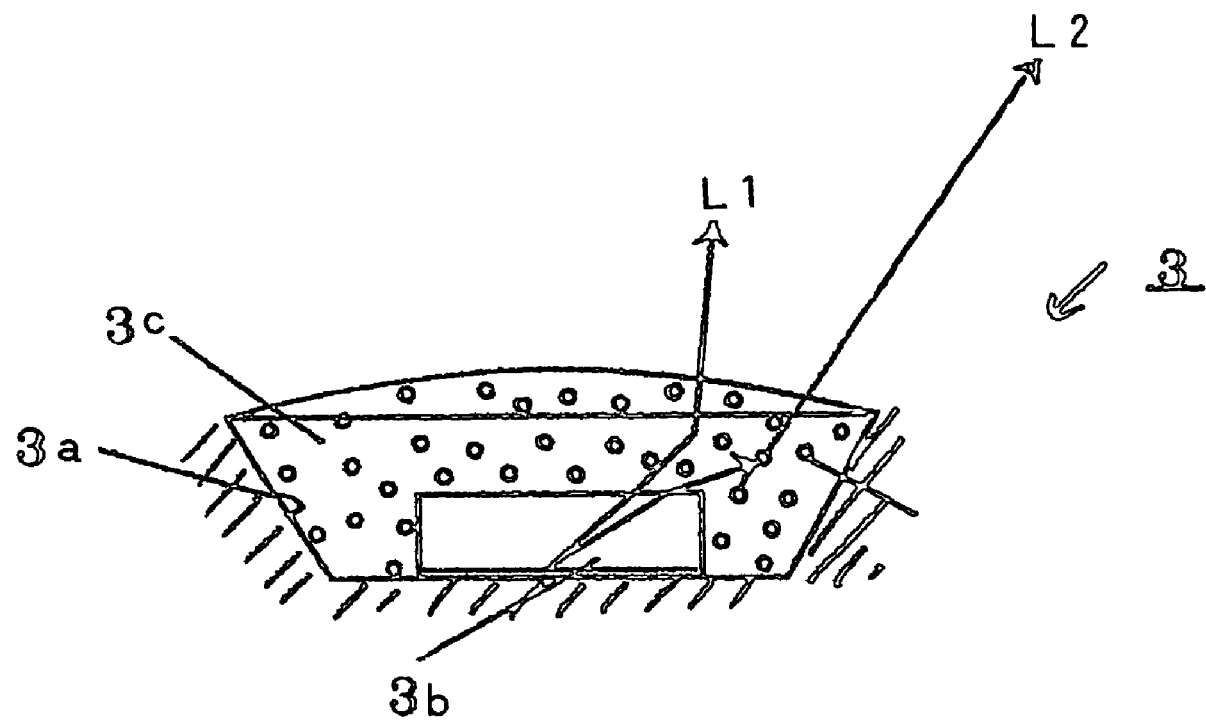
FIG. 15 is a schematic sectional view of an LED element for use in the vehicle headlight shown in FIG. 13 or 14.
Figure 16:
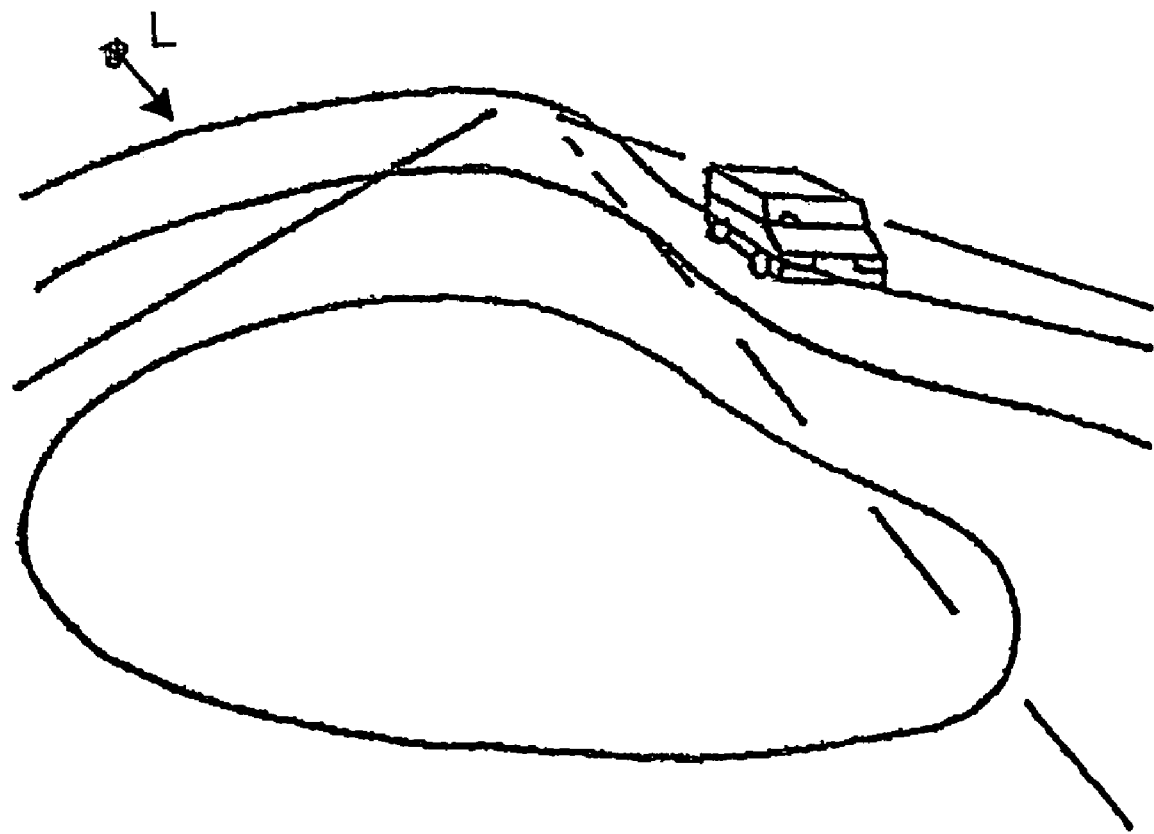
FIG. 16 is a schematic view showing a low beam light distribution characteristic irradiated forward from the vehicle headlights shown in FIG. 13 or 14.

FIG. 11 illustrates an OVAL brightness distribution while FIG. 12 shows the state of a light source in which the lens is flat and the light shielding plate and the emission portion are preferably close to each other. In particular, FIG. 12 shows a cross sectional view of a light source apparatus 11 that can include a flat lens 29 located above the LED elements 21. Leads 27 can be provided to supply current to the LED elements 21 via gold wires 28. A fluorescent substance 23 can be provided above the LED elements 21 in order to provide a particular characteristic wavelength light and protect the LED elements 21. In addition, the base 20 can be made of a heat radiating material, such as copper and the like. A cavity 24 (or several cavities) can be provided on the base 20 and the LED elements 21 can be mounted therein. Light shielding plate 13 is preferably located above the flat lens 29 and is shaped to cutoff light emitted from the LED elements 21 such that the light that is finally emitted from the light source apparatus 11 is in the form of a light distribution pattern for a vehicle lamp, such as a low beam headlight light distribution.

As described above, light emitted from each of the LED elements of the light source can fall on the incidence surface of a projection lens after passing by the light shielding plate. The light can be converged by the projection lens, causing the light L to be irradiated forward, forming a given light distribution characteristic defined by the light shielding plate, and thereby allowing a low-beam light distribution characteristic to be obtained so as to eliminate dazzling or glaring light to oncoming vehicles.

Each of the LED elements can be arranged so as to form the emission shape and the brightness distribution suited for the given light distribution pattern, allowing a light distribution pattern and brightness distribution suited for low beam to be obtained when the emission shape of each LED element is projected forward by the projection lens, for example, after formation of a cutoff by the light shielding means. At this time, formation of the emission shape of each LED element in a shape suited for the light distribution pattern ensures a reduction in the quantity of light that is blocked by the light shielding means, and improves utilization efficiency of light from each LED element for brighter irradiated light.

Thus, it is possible to provide an outstanding vehicle lamp suited for use as a headlight by using a plurality of LED elements as light source.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art. For example, the shape of each LED element 21 can vary, including shapes other than triangular, rectangular etc. In particular, the LED elements can have an oval, circular, polygonal or even non-symmetrical shape as viewed from their front. The particular light distribution pattern that is desired can be used to determine the most efficient shape of the LED elements. In addition, the light shielding device can be in plate form, but can also be configured as a reflective coating or opaque coating on another structure of the vehicle lamp, or can be integrated with another structure in the vehicle lamp. The shape of the light shielding device can also be determined by the type of light distribution that is desired as well as by the shape of each of the LED elements 21, and/or the shape of the array of LED elements 21. These variations along with other variations and embodiments fall within the spirit and scope of the invention, as set forth in the appended claims.

What is claimed is:

1. A light source apparatus for a vehicle headlight, comprising:
    a base;
    a plurality of LED elements located adjacent the base; and
    a light shielding device located adjacent the base and formed in the shape of a light distribution pattern, wherein the LED elements are arranged in such a manner as to correspond to the shape of the light shielding device, and in such a manner as to form an emission shape suited for a light distribution pattern for a vehicle headlight, and at least some of the LED elements are arranged along a given ridgeline, wherein
    the given ridgeline extends substantially parallel with at least a portion of an edge of the light shielding device, at least one of the LED elements is different in size as compared to another of the LED elements, and at least a relatively smaller one of the LED elements is located closer to the edge of the light shielding device than at least a relatively larger one of the LED elements.

2. The light source apparatus for a vehicle headlight according to claim 1, wherein each of the LED elements is substantially rectangular in exterior shape.

3. A light source apparatus for a vehicle headlight, comprising:
    a base;
    a plurality of LED elements located adjacent the base; and
    a light shielding device located adjacent the base and formed in the shape of a light distribution pattern, wherein the LED elements are arranged in such a manner as to correspond to the shape of the light shielding device, and in such a manner as to form an emission shape suited for a light distribution pattern for a vehicle headlight, and at least some of the LED elements are arranged along a given ridgeline, wherein
    the given ridgeline extends substantially parallel with at least a portion of an edge of the light shielding device, and
    each of the LED elements is substantially triangular in exterior shape.

4. The light source apparatus for a vehicle headlight according to claim 1, further comprising:
    a drive device capable of supplying different drive currents to the LED elements, wherein at least one of the LED elements is driven by a different drive current as compared to another of the LED elements.

5. The light source apparatus for a vehicle headlight according to claim 1, whrein at least another of the LED elelments is arranged along a second ridgeline.

6. The light source apparatus for a vehicle headlight according to claim 5, wherein the given ridgeline and the second ridgeline are at a given angle with respect to each other, and the given angle is between approximately 15 and 45 degrees.

7. The light source apparatus for a vehicle headlight according to claim 1, wherein the base includes at least one cavity and the plurality of LED elements are mounted in the at least one cavity located in the base.

8. The light source apparatus for a vehicle headlight according to claim 1, wherein each of the LED elements is arranged in such a manner as to form a brightness distribution suitable for a vehicle headlight.

9. The light source apparatus for a vehicle headlight according to claim 1, wherein each of the LED elements is substantially parallelogrammic in exterior shape.

10. A vehicle headlight, comprising:
    the light source apparatus according to claim 1; and
    a projection lens arranged such that a focus of the projection lens located in the direction of the light source apparatus is located in the vicinity of the light shielding device, wherein the projection lens is configured to irradiate forward the shape of an emission portion of the light source apparatus cut off by the light shielding device.

11. A light source, comprising:
    a base;
    a plurality of LED elements located adjacent the base and formed in a non-symmetrical array such that light emitted from the LED elements forms a light distribution pattern, wherein the light source has an optical axis located at a position in the substantial center of the array of LED elements and along which light is directed from the LED elements, and the array of LED elements is non-symmetrical about the optical axis, wherein
    uppermost LED elements of the entire array of LED elements are arranged in two linear rows, the rows being arranged at a given angle with respect to each other, and the given angle is between approximately 15 and 45 degrees.

12. The light source according to claim 11, wherein each of the LED elements is substantially rectangular in exterior shape.

13. The light source according to claim 11, wherein each of the LED elements is substantially triangular in exterior shape.

14. The light source according to claim 11, wherein at least one of the LED elements is different in size as compared to another of the LED elements.

15. The light source according to claim 11, further comprising:
    a drive device capable of supplying different drive currents to the LED elements, wherein at least one of the LED elements is driven by a different drive current as compared to another of the LED elements.

16. The light source according to claim 11, further comprising:
    a resin formed on a top surface of the base and over the LED elements.

17. The light source apparatus for a vehicle headlight according to claim 1, wherein each of the LED elements is substantially square in exterior shape.

18. The light source according to claim 11, wherein the base includes at least one cavity and the plurality of LED elements are mounted in the at least one cavity located in the base.

19. The light source apparatus for a vehicle headlight according to claim 4, wherein at least one of the LED elements is different in size as compared to another of the LED elements.

20. A vehicle headlight, comprising the light source apparatus according to claim 4, and
    a projection lens arranged such that a focus of the projection lens located in a direction of the light source apparatus is located on an optical axis of the light source apparatus.

21. A vehicle headlight, comprising the light source apparatus according to claim 11, wherein
    a portion of the LED elements is formed on a ridgeline, and
    a projection lens is configured such that a focus of the projection lens is located on the ridgeline.

22. A vehicle headlight, comprising the light source apparatus according to claim 5, and
    a projection lens arranged such that a focus of the projection lens located in a direction of the light source apparatus is located in the vicinity of an intersection of the given ridgeline and the second ridgeline.

23. The light source apparatus for a vehicle headlight according to claim 1, wherein at least one of the LED elements is polygonal in exterior shape.

24. The light source apparatus for a vehicle headlight according to claim 4, wherein at least one of the LED elements is parallelogrammic in exterior shape.

25. The light source apparatus for a vehicle headlight according to claim 4, wherein at least one of the LED elements is substantially square in exterior shape.

26. The light source according to claim 11, wherein at least one of the LED elements is parallelogrammic in exterior shape.

27. The light source according to claim 11, wherein at least one of the LED elements is substantially square in exterior shape.

28. The light source according to claim 11, wherein at least one of the LED elements is substantially polygonal in exterior shape.

29. The light source according to claim 11, wherein at least some of the LED elements are located along a ridgeline.

30. The light source apparatus for a vehicle headlight according to claim 4, wherein the light source apparatus has an optical axis, a horizontal light distribution axis perpendicular to the optical axis, and a vertical light distribution axis perpendicular to both the optical axis and the horizontal light distribution axis, and the given ridgeline extends at an angle with respect to the horizontal light distribution axis.

31. A light source, comprising:
    a base;
    a plurality of LED elements located adjacent the base and formed in a non-symmetrical array; and
    a light shielding device located adjacent the base and configured to cut off light from the LED elements into the shape of a low beam light distribution pattern, the light shielding device having a first edge and a second edge extending diagonally from the first edge; and
    wherein one side of each of at least some of the LED elements is arranged in parallel with the first edge of the light shielding device; and
    the light source has a center bottom portion having a higher brightness portion as compared to other portions of the light source.

32. The light source of claim 31, wherein one side of at least some other of the LED elements is arranged in parallel with the second edge of the light shielding device.

* * * * *